June 26, 1962 J. BARDEEN 3,041,166

XEROGRAPHIC PLATE AND METHOD

Filed Feb. 12, 1958 2 Sheets-Sheet 1

*INVENTOR.*
JOHN BARDEEN

*BY* Frank A. Steinhilper

ATTORNEY

June 26, 1962 J. BARDEEN 3,041,166
XEROGRAPHIC PLATE AND METHOD
Filed Feb. 12, 1958 2 Sheets-Sheet 2

INVENTOR.
JOHN BARDEEN
BY George W. T. Simmons
ATTORNEY

United States Patent Office 3,041,166
Patented June 26, 1962

3,041,166

XEROGRAPHIC PLATE AND METHOD

John Bardeen, Champaign, Ill., assignor to Xerox Corporation, a corporation of New York Filed Feb. 12, 1958, Ser. No. 714,929
38 Claims. (Cl. 96—1)

This invention relates in general to photosensitive members and in particular to improved and more highly responsive photosensitive members such as are particularly useful in xerography.

It is the usual practice in the xerographic arts to form an electrostatic image by first evenly distributing electrical charge on the surface of a photoconductive member and then exposing the surface to a pattern of activating radiation corresponding to the desired image. More specifically, in the electrostatic photographic process that is xerography, a radiation sensitive element or plate is customarily used that is basically composed of a photoconductive layer on a conductive base. In the absence of any activating radiation, a uniform electrostatic charge is placed on the free surface of the photoconductive layer which surface is subsequently exposed to a radiation image, the conductivity through the layer in exposed areas thereby being considerably increased over that in unexposed areas. As a result, a differential is produced between the exposed and unexposed regions in the rate of charge flow from the free surface to the base which, in turn, results in a differential between these regions in the amount of charge remaining on the free surface of the photoconductive layer. It is thus seen that an electrostatic image remains on the surface that corresponds to the incident radiation image.

Although the xerographic processes and devices produce highly satisfactory results, it should be recognized that the methods employed are handicapped by the fact that the photoconductive layers usually used are far from ideal. An ideal radiation sensitive material, for example, possesses an infinite resistivity in the absence of radiation and thereby has the ability to retain the charge on its surface for long periods of time without diminution. In actual practice, there is usually a degree of charge leakage which causes an undesired loss in quality of the final image. Also, the resistivity of an ideal photoconductive layer is sharply reduced when exposed to radiation, thereby permitting the rapid passage of surface charge through the photoconductive layer to the base. In other words, an ideal photoconductive material is highly sensitive to radiation. Such sensitivitiy is important because it makes possible the production of highly satisfactory images in less time than previously required and also with less intense radiation which means an increase in light sensitivity. In actual practice it has not yet been possible to produce directly a photosensitive material having the above characteristics to the desired degree.

An object of the invention is to provide a new photosensitive member particularly for xerography having an increased response to activating radiation, that is, an increased photographic speed.

It is a further object of the present invention to provide a new xerographic photosensitive member that can retain electric charge on its surface without loss for relatively long periods of time.

According to the invention there is provided a photosensitive plate adapted to give a photon efficiency substantially in excess of 1 when charged to a predetermined polarity, comprising an insulating layer possessing long range charge carriers, a barrier semiconductor layer one of whose surfaces is in intimate surface contact with said insulating layer, the electric current carriers in said barrier semiconductor being predominantly of the same polarity as the polarity of charging, and a solid supporting body having a high density of electric current carriers of polarity opposite to the polarity of charging, the solid body being in intimate surface contact with the opposite surface of the barrier semiconductor layer to support the insulating layer and the semiconductor layer. Thus, if the semiconductor layer has a p-type conductivity the insulating layer must be charged positively and if the semiconductor layer has n-type conductivity, the insulating layer must be charged negatively if, in each, the desired results are to be obtained.

The semiconductor may include a second layer adjacent the supporting solid body having a conductivity type opposite to that of the other semiconductor layer.

The insulating layer is preferably selenium, although other known materials having long range charge carriers such as sulphur, cadmium sulfide, cadmium selenide, etc. may be used, and the semiconductor layer is preferably selenium with a p- or n-type impurity. When the semiconductor layer is p-type, the solid supporting body is a low work function metal, and when the semiconductor layer is n-type, the supporting body is a high work function metal. When the plate is to be exposed through the front, the insulating layer must either be transparent to the incident radiation or a photoconductive insulating material. When the plate is to be exposed through the supporting body, the supporting body must be transparent to the incident radiation and the insulating layer need only have a long range for charge carriers, i.e., need not be photoconductive, as will be more fully disclosed hereinbelow.

In order that the invention may be clearly understood, reference will now be made to the accompanying drawings in which two embodiments of the invention are illustrated by way of example, and in which.

Figure 5:
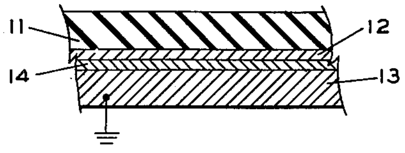
FIG. 5 is a diagrammatic cross section of a photosensitive member according to another embodiment of the invention.
Figure 9A:
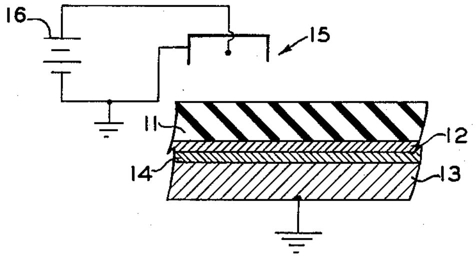
Figure 9B:
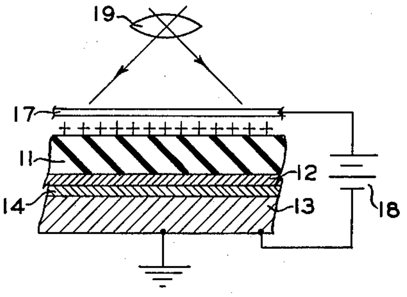
Figure 9C:
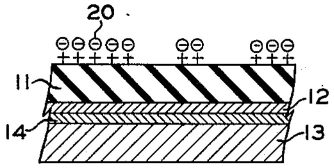

FIGS. 9(*a*), 9(*b*) and 9(*c*) are diagrammatic cross-sectional views of the xerographic plate of FIG. 5 illustrating its use in xerography.

Figure 1:
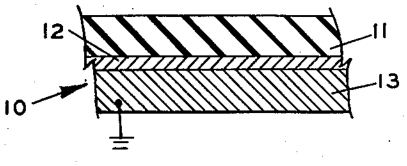
FIG. 1 is a diagrammatic cross section of a photosensitive member according to a first embodiment of the invention.

Referring now to the drawings, there is diagrammatically shown in FIG. 1 a photosensitive member according to the present invention, the member being generally designated 10 and comprising an insulating layer 11 overlying a conductive backing member 13 with an intermediate semiconductor barrier layer 12 therebetween. This composite member is suitably a xerographic plate, film, cylinder or like xerographic member. In general, the photosensitive member is characterized by being smooth and uniform in its surface characteristics and large enough so that a xerographic image or like photographic image may be recorded on the surface. If desired, the base member 13 may be a flat surface such as a metallic plate or other flat conductive surface including conductively coated glass or other transparent surfaces as well as surfaces of the metals and the like. Alternatively, for many purposes it is desirable that the conductive backing 13 be the surface of a cylinder or a continuous belt whereby the photosensitive member may be continuously processed through an automatic continuously moving machine. Likewise, the base member 13 may be a suitable flexible film, web or sheet of a conductive or conductively-coated material which may as desired be transparent or opaque. In any case, the backing member 13 is both a support member for the insulating film and has at least one conductive surface in contact with layer 12 of FIG. 1 or layer 14 of FIG. 5.

The layer 11 of member 10 shown in FIG. 1 is about 20 to 200 microns thick, preferably between 50 and 80 microns thick. The thickness of layer 11 has a decisive effect on the xerographic properties of the plate. Thus, layer 11 must be at least about 20 microns thick so that layer 11 will have a relatively low capacitance relative to the support member 13 thus enabling it to accept a high enough potential to permit the deposition of sufficient electroscopic powder thereon to give a high quality visible image. In addition, as relatively fewer charges are needed to give the desired potential, fewer charges need be moved in layer 11 to produce an electrostatic image thereon. This results in faster plates. The upper limit on the thickness of layer 11 is not so critical. As the thickness becomes progressively greater relative to the range of charge carriers therein, a point is reached where the number of charge carriers caught in traps on each exposure of the plate renders the use of the plate undesirable. For this reason, layer 11 should not be thicker than about 200 microns. Further, layer 11 is of the type having a very small concentration therein of free electrons and/or holes, holes being positive electrical charges. Accordingly, layer 11 is a good insulator in the absence of activating radiation. More specifically, layer 11 is of the type that can support an electrostatic charge for a relatively long period of time without any significant diminution in the absence of activating radiation. This is due to the extremely high resistivity of layer 11, which resistivity is in the order of $10^{13}$ or $10^{14}$ ohms-cm. or higher in the absence of radiation. Since the resistivity of semiconductors is less than $10^{9}$ ohms-cm., layer 11 may, therefore, be very validly referred to as an insulating layer and, when photoconductive, as a photoconductive insulating layer.

A material is referred to as being of the p-type when the majority charge carriers are holes and n-type when the majority charge carriers are electrons. The Hall constant gives the sign of the majority charge carrier. Whether it is desired to use layer 11 as the photoconductor or not, it is essential that layer 11 have a long range for at least one polarity of charge carriers. If it is desired to use layer 11 as the photoconductor, it is essential that layer 11 have a long range for both polarities of charge carriers as well. If it is not desired to use layer 11 as the photoconductor, layer 11 may also have a long range for both polarities of charge carriers, but it is not essential. The reasons for these requirements, as well as materials possessing them, will be more fully understood when FIGS. 2–4 and the specific embodiments of the invention are taken up for discussion.

Intermediate layer 12 is a layer of semiconductor material disposed between photoconductive layer 11 and base 13 and is adapted to prevent the injection of free charge from base 13 into layer 11 except in the presence of radiation at which time the semiconductor layer 12 aids in the discharge of the distributed charge. Thus, if the charge distributed on the free surface of layer 11 is to be positive, semiconductor layer 12 must necessarily be so selected as to be strongly p-type relative to layer 11 and, similarly, if negative charge is to be distributed on the surface, layer 12 must necessarily be so selected as to be strongly n-type relative to layer 11. The reasons for establishing this relationship between layers 11 and 12 as well as the other necessary requirements for layer 12 will be more fully understood later when FIGS. 2, 3 and 4 are taken up for discussion.

Figure 2:
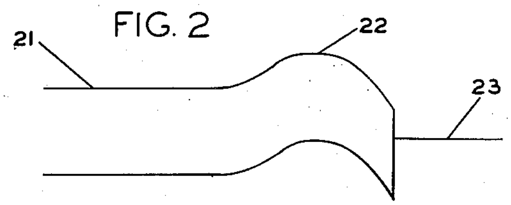
FIG. 2 is an electron-energy diagram of the photosensitive member of FIG. 1 in the absence of any potential gradient thereacross.
Figure 3:
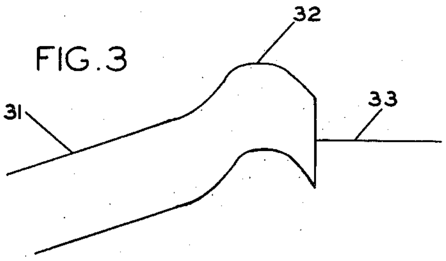
FIG. 3 is an electron energy diagram of the member illustrated in FIG. 1 with a high potential gradient of positive polarity applied to the member.
Figure 4:
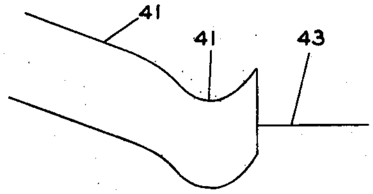
FIG. 4 is an electron-energy diagram of a photosensitive member of the type illustrated in FIG. 1 with a high potential gradient of negative polarity applied thereacross.

Considering now FIGS. 2 to 4, there is shown therein a series of energy level diagrams which may be used to illustrate the operation of composite member 10, the vertical ordinate in these diagrams indicating electron energy and the horizontal ordinate (or abscissa) indicating positions at points within member 10.

Referring in particular to FIG. 2, lines 21 represent the energy levels of free and bound electrons in layer 11, the upper line representing the minimum energy of a free electron and the lower line representing the maximum energy of a fixed electron in a valence bond. Thus, the distance or gap between the two lines represents the minimum amount of work required to dislodge an electron in the fixed state and bring it to the free state. As to curved lines 22, they represent corresponding energy levels of electrons in semiconductor layer 12. Consequently, the gap between upper and lower lines 22 also represents the work required to bring a fixed electron to the free state. It should be noted, however, that the width of the gap between lines 22 is dependent upon the type of material used for semiconductor layer 12 and, therefore, need not necessarily be of the same width as the gap between lines 21. With respect to line 23, this line is used to indicate or represent the Fermi energy level in conductive base 13.

Summarizing, the diagram of FIG. 2, in going from left to right, illustrates the various energy levels that may be encountered in going through member 10 from top to bottom when no potential gradient or electrical field is externally applied across member 10.

When a potential gradient or electric field is externally applied to member 10 as is the case when electrical charge is distributed on the free surface of layer 11, lines 21 representing the previously mentioned energy levels are caused to slope downwardly or upwardly to the left as indicated by lines 31 and 41 of FIGS. 3 and 4, respectively, the downwardly sloping lines of FIG. 3 occurring when the distributed charge is positive and the upwardly sloping lines of FIG. 4 occurring when the distributed charge is negative.

In explaining the significance of lines 21, 31 and 41 as well as lines 22, 32 and 42, it should be mentioned that free electrons are confined to the energy region above the upper boundary comprised by upper lines 21 and 22, 31 and 32, and 41 and 42 and tend to move from a high to a low energy state which means, referring to the figures, that they tend to move down hill along the upper lines in the diagrams. On the other hand, free positive charges or holes are confined to the energy region below the lower boundary comprised by lower lines 21 and 22, 31 and 32, and 41 and 42 and also tend to move from a high to a low energy state which, in the case of holes, means that they tend to move up hill along the lower lines in the diagrams.

Thus, referring to member 10 of FIG. 1, free electrons at energy level 33 in base 13 ordinarily would tend to pass into lower energy level 31 and in so doing move into photoconductive layer 11 when an electric field is present in member 10, but are prevented from doing so by the barrier presented in the form of upper energy level 32 which corresponds to a p-type semiconductor layer 12. The rate of injection is dependent on the height of this barrier which is the activation energy for thermal injection from base 13 into semiconductor 12. For use as a xerographic plate, this activation energy must be at least about 0.7 electron volt. The novel plates of the instant invention are particularly designed for use in producing high quality continuous tone reproductions. The exacting requirements of the continuous tone art require a dark decay of no more than about one volt per minute. To meet this the activation energy must be at least about 0.8 electron volt. If the semiconductor has a sufficiently wide band gap, the activation energy will be adequate without reference to the Fermi level of support 13. In general, however, the activation energy is a function of the work function of support 13. It is thus seen that the interposition of a p-type semiconductor layer 12 between photoconductive layer 11 and base 13 substantially reduces dark decay and, therefore, promotes the retention of positive charge on the free surface of layer 11.

It should be noted that if the reverse polarity is used to sensitize layer 11 (i.e., if member 10 with a p-type layer 12 is sensitized with negative electrostatic charges) layer 12 is not effective to prevent injection of carriers from base 13. The result is a substantially reduced ability of layer 11 to hold a charge in the dark.

Consider, now, the case where layer 11 is a photoconductor. In the presence of incident radiation, electron-hole pairs are formed on or near the free surface of layer 11. The holes, under the influence of the electric field, tend to move downwardly from layer 11 to base 13 in FIG. 1 or, stated differently, tend to move upwardly along lower lines 31 and 32 of the energy-level diagram of FIG. 3. Since the right hand portion of lower line 32 slopes downward to the right, which means a rise in energy level for holes (termed a "hook"), the holes moving through member 10 are trapped in semiconductor layer 12 and thereby are held in position near base 13. The reason for the previous requirement (that layer 11 have a long range for the majority charge carrier when it is the photoconductor) is now seen: It is essential to permit the holes to reach layer 12. This hook is effective to detain holes in layer 12 for an appreciable time before they enter base 13. The hook formed by the junction between layer 12 and base 13 is effective to detain a hole while several electrons are injected into layer 12 for each hole detained therein. As each hole corresponds to one photon of light, it is seen that several electrons are injected for each photon. This buildup of trapped positive charge reduces the attraction of layer 12 for holes but also reduces the barrier against electrons in base 13, thereby having the effect of lowering energy level 32 of layer 12. As a result, electrons are now able to pass from base 13 into layer 12 and therethrough to layer 11 where they neutralize positive charge still deposited on areas of the surface of layer 11 that have been exposed to radiation. Thus a relatively small number of electrons and holes produced by the direct action of radiation incident on layer 11 induce a much larger flow of electrons from base 13 to the surface of layer 11. This means that in accordance with the present invention, a desired electrostatic image may be formed on the surface of layer 11 with incident radiation of reduced intensity. The reason for the requirement that layer 11 have a long range for the minority charge carrier is now seen: It is essential to permit electrons injected into layer 11 by reason of the action of layer 12 to reach the free surface of layer 11.

In the above explanation, we treated the situation where the distributed charge on the surface of layer 11 was positive and the semiconductor material of layer 12 was of the p-type. We now proceed to a discussion of the situation where the charge on the surface of layer 11 is negative and semiconductor layer 12 is of the n-type. Accordingly, referring to FIG. 4, it will be seen by those skilled in the art that the energy diagram of FIG. 4 is a mirror image (along the vertical axis) of the diagram of FIG. 3 which merely means that electrons produced in layer 11 by incident radiation will now be trapped in layer 12, thereby inducing a flow of holes to the surface of layer 11. Thus, in the present case as well, an electrostatic image can be formed on the surface of layer 11 with less intense incident radiation or in less time. It should be mentioned at this point that although holes are known to exist in only three metals, namely, beryllium, cadmium and zinc, it is a well established fact that holes can be injected into semiconductor layers at the interface of the semiconductor with a metal. Thus, in connection with FIG. 4, it is no more difficult to supply the holes required for enhanced conductivity than it would be to supply electrons as indicated in our earlier discussion relating to FIG. 3. On this point, see for example pages 95 to 101 of the book entitled Electrons and Holes in Semiconductors written by William Shockley, published by D. Van Nostrand Company, Inc. in 1950.

Considering layer 11 still further, the characteristics desired for layer 11 can be adequately achieved in vitreous appearing layers of selenium which are believed to be substantially amorphous selenium. It has been found that such selenium layers conduct both electrons and holes but that the mobility for holes is approximately ten times that for electrons. Vitreous selenium, then, can be considered as p-type. Vitreous selenium while possessing a long range for holes has a very short range for electrons, the minority charge carriers. Thus, before vitreous selenium can be used in the novel plates of the instant invention for photoconductive layer 11, it must be treated to increase the range therein of the minority charge carriers. It is presently believed that in vitreous selenium, the selenium forms long chains with an unpaired electron at each end. This unpaired electron creates a possible electron trap. If two or more selenium chains terminate in the same area, the result is likely to be a fairly deep electron trap. Under favorable circumstances, oxygen and selenium are isomorphous. If one of the chains terminates in oxygen, the trap is likely to be deeper due to the more electronegative character of oxygen. Accordingly, it has been found that if selenium is treated with an oxygen acceptor, and particularly one possessing free electrons, the material acts to remove oxygen and may also supply the need of the unpaired electron in the selenium chain thus "filling" the trap. A satisfactory process for accomplishing this has been found to be adding iron filings to a crucible containing pellets of xerographic grade selenium and evaporating the selenium under vacuum at a temperature well below the boiling point of iron. Such a treatment "fills" the trap sites in the vitreous selenium to such an extent as to impart a long range to electrons thereby permitting the use of vitreous selenium for layer 11.

Selenium so treated may be alloyed with arsenic or tellurium as described, for example, in U.S. 2,803,542, U.S. 2,803,541, and U.S. 2,745,327 for use as layer 11. When alloyed with $As_2S_3$, selenium becomes n-type while still being an effective photoconductive insulator. CdS and CdSe have long ranges for electrons and high purity vacuum evaporated films thereof may be used for layer 11 when it is desired to use an n-type photoconductor.

Consider now the case where layer 11 is not used as the photoconductor. In this embodiment of the invention an electrostatic charge of a given polarity is placed on the free surface of layer 11 as is the case when layer 11 is photoconductive. Layer 12 is now exposed to activating radiation. This may be done in either of two ways: First, where the support member 13 is transparent, exposure may be through the back and, second, if the support layer is opaque to the activating radiation, exposure may be through the front in which case layer 11 must be transparent to the activating radiation. Suitable transparent materials for layer 11 in this embodiment would include a transparent plastic material having long range for charge carriers of the desired polarity and amorphous selenium. Amorphous selenium only weakly absorbs red light and is photoconductively insensitive to radiation having a wavelength greater than about 560 millimicrons. Thus, a significant portion of red light will penetrate through a 20 to 30 micron thickness of amorphous selenium to activate inner layer 12. The incident radiation impinging on layer 12 (either on the front or on the rear as described herein) is absorbed in layer 12 to provide a hole-electron pair. The electron will tend to move to the free surface of layer 11, the hole remaining in layer 12 where it is held in the hook causing injection of additional electrons as described above. On arriving at the free surface of layer 11, the electron will neutralize a positive charge thereon thus creating the electrostatic image on the surface of layer 11. It is to be noted that in this method of operation any photoconductive properties of layer 11 are not used. Layer 11 acts merely to store electrostatic charge to create the field thereacross and has the property of long range for charge carriers. Thus, where it is not desired to use the photoconductive properties of layer 11, the layer need have a long range for carriers of only one polarity, that is, the charge carriers have the opposite polarity from that used to sensitize layer 11, whereas if it is desired to use layer 11 as the photoconductor it is essential that layer 11 have a long range for both the majority and the minority charge carriers.

The requirements for layer 12 may now be stated. First, the layer must be from about 0.1 to 5 microns thick. In general, the thinner layer 12 is, the more effective becomes the charge retained in the hook to draw charges from base 13. However, it is not desirable to make the layer thinner than about 0.1 micron as the layer must be thick enough for the hook to form, to prevent diffusion of material from layer 11 and base 13 into layer 12 which would destroy separate identity of layer 12 and because of the impracticality of obtaining uniformity in layers thinner than about 0.1 micron. It has been stated that layer 12 is a semiconductor. This arises from the necessity that layer 12 be more strongly p- or n-type than layer 11. Semiconductors have a resistivity no greater than about $10^9$ ohms-cm. Thus, compared to layer 11, layer 12 is relatively conductive. Accordingly, virtually none of the applied electrostatic field will be across layer 12. Therefore, the sole force moving charge carriers across layer 12 from the base 13 will be the diffusion due to the concentration gradient of the charge carriers. If the layer is thicker than about 5 microns, it will be unlikely for the injected charged carriers to cross layer 12 under the relatively weak diffusion force. From this consideration it is desirable that the layer be no thicker than about 2 or 3 microns. In addition to establishing the upper limit on the thickness of layer 12, this also establishes the necessity that layer 12 have a long range (i.e., long enough to traverse layer 12) for the minority charge carrier (i.e., when layer 12 is p-type, electrons are the charge carrier injected from backing 13 and conversely when layer 12 is n-type).

The necessity for layer 12 being more strongly p- or n-type is also evident. Assume the situation where the material of layer 12 has approximately the same band gap as the material of layer 11. When the layer structure 10 is formed, the Fermi levels will line up. If layer 12 is not more strongly p or n than layer 11, line 22 of FIG. 2, instead of being elevated above line 21 will merely be on a plane therewith. On the other hand if layer 12 is more strongly p-type than layer 11, then when the Fermi levels line up, which occurs automatically on the formation of structure 10, energy level 22 will automatically be above energy level 21 in proportion to the amount that layer 12 is more strongly p-type than layer 11. Similarly, in FIG. 4, line 42 will be lower than line 44 in proportion to the amount that layer 12 is more strongly n-type than layer 11.

Vitreous selenium is slightly p-type. When vitreous selenium is used as layer 11, suitable p-type materials for layer 12 would then comprise metallic selenium or selenium treated with a halogen impurity. Xerographic quality selenium contains less than five parts halogen in a million parts selenium. The addition of halogen to xerographic quality selenium renders the material more p-type but also renders it too conductive for use as a photoconductive insulator in xerography. As layer 12 is a semiconductor rather than a photoconductive insulator, the increased conductivity is not objectionable. Suitable n-type materials for layer 12 comprise selenium doped with arsenic, tellurium, etc.

Because of the large number of trap sites for holes, if cadmium sulfide or selenide is used for layer 11, it should be used only to provide long range carriers for electrons—i.e., with a p-type layer 12 which layer 12 also acts as the photoconductor.

The use of the same material for layer 11 and layer 12 with reliance on doping to impart the requisite degree of conductivity to layer 12 is particularly preferred as it assures easy injection of carriers into layer 11 as well as an even matching of the band gaps for layer 11 and layer 12.

From the above discussion, it will be apparent to those skilled in the art that the original migration of a small quantity of charge from the free surface of photoconductive insulating layer 11 makes possible a relatively free interchange or flow of charge between layer 11 and conductive backing member 13, whereby there is obtained substantial discharge of the layer by the action of a very small number of photons or units of absorbed radiation energy. This is essentially a photomultiplier effect whereby one photon results in the migration of many units of electrical charge.

In this connection, it should be realized that by a proper balancing of the degrees of p- and n-type conductivity in layers 11 and 12, and by a proper correlation of the work function of backing member 13 with this balance of p- and n-type conductivity between the layers, that a vast multiplication in photon efficiency can be achieved. Thus, for example, whereas one photon of absorbed energy ordinarily creates only one electron-hole carrier pair, in the instance described heretofore one photon of absorbed energy prepares the way for the migration to layer 12 from base 13 of many charges. Thus, a greatly increased photon efficiency can be achieved in accordance with the present invention.

One of the unique aspects of the instant invention is the use of relatively conductive material (layer 12) to render an already good insulator (layer 11) even more highly insulating in the dark with the right polarity of charging. To illustrate this effect a base plate consisting of a sheet of polished brass 0.050 inch thick was thoroughly cleaned to remove therefrom all traces of dirt, films and the like, leaving a bright, clean, brass surface, substantially free from all surface layers. The thus prepared plate was placed in an evacuation chamber and vacuum applied to result in a pressure of about 1 micron of mercury. The temperature of the brass plate was controlled to about 60 degrees centigrade during the entire operation. A charge of substantially pure selenium was placed in an evaporation boat and selenium was evaporated from the boat onto the surface of the brass plate by heating the selenium source in the vacuum. The evaporation was continued until a layer of selenium about ½ micron thick was deposited on the brass surface after which the evaporation was discontinued and air admitted to the vacuum chamber. The plate at this stage showed a very thin coating of shiny, red vitreous or amorphous selenium on the surface of the brass.

A small amount of chlorine was introduced into this selenium layer in a varied concentration by exposing the selenium layer to chlorine vapor at a localized point while permitting diffusion of the vapor to accomplish a continuous gradation of chlorine concentration in the selenium layer. This was accomplished by placing the selenium coated brass plate within a polyethylene bag or wrapping and injecting chlorine vapor into the bag by means of a hypodermic puncturing the bag at a selected point. An area about 3 to 4 inches in radius was visibly affected by the injection of 3 cc. of chlorine gas into the space adjacent to the plate. It could be observed that the effect was greatest at or near the center of the area and that the apparent concentration of the chlorine decreased toward the edges of the surface. It is believed that this concentration ranged from zero at the edges to about 2% at the center or point of injection.

The thus treated selenium coated brass plate was again placed in the evaporation chamber, vacuum applied to result in a pressure of about 1 micron of mercury, and a layer of substantially pure selenium 20 microns thick was deposited over the intermediate layer, again at a temperature of about 60 degrees centigrade. Air was admitted to the evaporation chamber and the plate then removed. The portion which had been exposed to chlorine vapor could be detected by a slight pattern visible through the selenium layer deposited on top of this area.

The plate prepared as above described was tested for its ability to hold an electrostatic charge deposited thereon and by the rate of dissipation of such charge in the absence of illumination. This was accomplished by passing over the surface of the plate a corona discharge electrode consisting of a plurality of fine conductive strands maintained at a potential in the order of 6,000 to 7,000 volts positive polarity with respect to the backing plate. In the area which had been chlorine treated, a substantial charge in the order of 500 volts could be placed and supported on the surface of the plate for a period of many minutes whereas in the areas not so treated with chlorine the charge was rapidly dissipated. It is apparent therefore that in the areas to which chlorine had been added the plate was characterized by the ability to hold a charge and by a low rate of charge dissipation in the absence of activating radiation, and this is true in spite of the fact that halogen-containing and particularly chlorine-containing selenium is generally considered to be substantially more conductive than substantially pure selenium.

Figure 10:
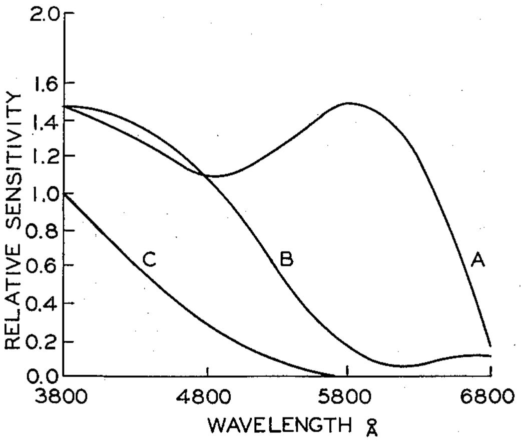

To illustrate a plate according to FIG. 1 a piece of glass having on one surface thereof a thin coating of tin oxide thereby forming a conductive coating thereon was placed in a vacuum evaporator and held at approximately 23° C. A layer of selenium 0.2 micron thick was then vacuum evaporated on the tin oxide surface at a pressure of about 1 micron of mercury. The plate was then removed from the vacuum system and heated in an oven for thirty minutes at 87° C. As a result of this heat treatment the thin selenium layer was transformed to gray crystalline selenium. The glass base plate, along with an aluminum base plate were then inserted into the vacuum system. Iron filings were added to the selenium used to charge the evaporation boat and a 50 micron layer of amorphous selenium evaporated on the metallic selenium and aluminum surfaces. As a result of the iron filings the electron traps in the selenium were filled thereby giving electrons a relatively long range. The two plates were then electrostatically charged to place a positive charge on the free surface thereof using a corona charging unit obtained from The Haloid Company, Rochester, New York, under the name XeroX scorona unit. The plates were then exposed for a few seconds to monochromatic light calibrated to give equal energies at all wavelengths. The fall in potential was measured using a vibrating probe electrometer. The sensitivity of the aluminum base plate at 3800 angstroms (i.e., the fall in potential for exposure to this wavelength) was termed unity. The fall in potential due to exposure for all wavelengths for all plates were then expressed relative to this value as unity. The results are plotted in FIG. 10. The plate with the intermediate layer of metallic selenium was processed twice—the first time being exposed through the front, i.e., using the photoconductive properties of the vitreous selenium and, secondly, was exposed through the rear, i.e., using the vitreous selenium merely as a material having a long range for charge carriers. Curve A represents the relative sensitivity for exposure through the rear and curve B the relative sensitivity for exposure through the front. Curve C shows the relative sensitivity of the plate which does not contain layer 12. The srtiking increase in light sensitivity due to layer 12 is thus readily apparent. The addition of the strongly p-type layer 12 results in a plate having 6–10 times the light sensitivity of a regular selenium xerographic plate. It is also significant that this increase can be obtained in the embodiment of FIG. 1 without the necessity for using an externally maintained field during exposure as will be discussed more fully hereafter in considering the embodiment of FIG. 5 and particularly FIGS. 9(*a*), (*b*) and (*c*).

Illustrative of a plate according to the instant invention which may be used with negative sensitization: a tin oxide-coated glass substrate was coated with a one micron coating of selenium-tellurium containing 22 atomic percent tellurium. The layer was formed by simultaneous vacuum evaporation from separate crucibles in order to insure accurate control of the amount of tellurium—a step made necessary by reason of the high boiling point of tellurium relative to selenium. A 50 micron layer of vitreous selenium was then deposited on top of the selenium-tellurium layer using vacuum evaporation. It should be noted that in this plate that if exposure is to be through the rear, ordinary xerographic quality selenium may be used. However, if exposure is to be through the front, it is necessary to use selenium for layer 11 which has been treated as described above to provide a long range for electrons. In contrast to the previous plate which is usable with positive polarity charging, this plate requires negative polarity charging.

Among the impurities that may be added to the selenium in small quantity to impart n-type photoconductivity generally are arsenic, antimony and bismuth. Arsenic has a favorable vapor pressure relative to selenium making relatively easy to control the addition of arsenic to selenium in a vacuum evaporation process. Conversely, the impurities employed to impart p-type conductivity to the selenium include fluorine, chlorine, bromine and iodine. It is to be understood that numerous other elemental impurities or compounds added in small amounts may also impart p-type or n-type conductivity, and the list is by no means limited to those named. For example, silver and tellurium have also been found to make liquid selenium an n-type semiconductor.

The low work function conductors employed are those conductors in which a relatively low amount of energy is required to remove one or more electrons from its orbit or position in the solid to a point effectively outside such solid. These low work function conductors generally are those which appear toward the top of the electromotive series, such as magnesium, aluminum, beryllium and other light or active metals. On the other hand, the high work function metals or conductors are those which require a comparatively high quantum of energy to remove one or more electrons from the atom or molecule and such high work function metals are those which appear toward the bottom of the electromotive series and include metals such as copper, lead, gold, silver and the like. It is to be understood that the selection of the particular metal or other conductive member for base 13 is to be determined by its relative position in a table of energy diagrams and is to be selected so that its work function is correlated with the energy level diagram of the layer 11 and the semiconductor layer 12. Thus, in the embodiment shown in FIGS. 1 and 2, the work function of base 13 is relatively low so that the energy level 22 of layer 12 is pulled down toward base 13 to form the hook or barrier causing temporary trapping of holes in layer 12.

Referring now to FIG. 5, there is shown another embodiment of a photosensitive member 10. As shown in the figure, composite member 10 comprises an insulating layer 11 disposed on a surface of a first intermediate semiconductor layer 12 which in turn is in overlying contact with a second intermediate semiconductor layer 14 disposed between semiconductor layer 12 and a conductive backing member 13. Layers 11 and 12 and base 13 are of the same type as previously described in connection with the embodiment of FIG. 1. Accordingly, a detailed description of these layers and the base is not deemed necessary here.

Figure 6:
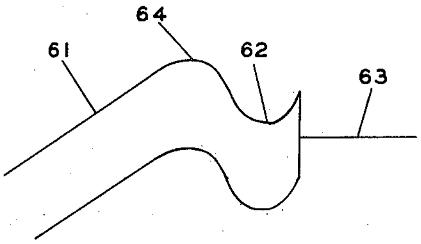
FIG. 6 is an electron-energy diagram of the member of FIG. 5 with a high potential gradient of positive polarity applied thereacross.
Figure 8:
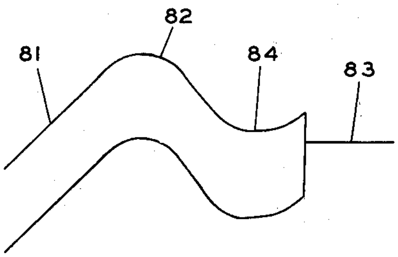
FIG. 8 is an electron-energy diagram similar to that of FIG. 6 and is representative of a photosensitive member of the type shown in FIG. 5 wherein the conductive backing member is a low work function conductor.
Figure 7:
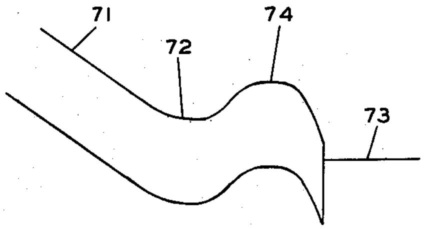
FIG. 7 is an electron-energy diagram of a photosensitive member of the type shown in FIG. 5 with a high potential gradient of negative polarity applied thereacross.

In considering the operation of photosensitive member 10 of FIG. 5, reference is made to the energy level diagrams for this embodiment as shown in FIGS. 6, 7 and 8. The energy level diagrams of FIGS. 6, 7 and 8 are of the same type and illustrate the same information as the energy level diagrams of FIGS. 2, 3 and 4, the only significant difference between the two sets of diagrams being that the former diagrams are "double humped," as at 62 and 64 in FIG. 6, whereas the latter diagrams are "single humped." The "double humps" are due to the fact that composite member 10 of FIG. 5 includes two intermediate semiconductor layers rather than one as in the embodiment of FIG. 1. The purpose for both layers 12 and 14 will be more clearly understood later.

Semiconductor layers may be either of the p-type or of the n-type. The particular type of each layer determines whether the electrical charge distributed on the free surface of layer 11 is positive or negative. Thus, in connection with the diagram of FIG. 6, when semiconductor layer 12 is of the p-type in electrical conductivity, semiconductive layer 14 is of the n-type and positive charge is distributed on the free surface of photoconductive layer 11. As a result curved lines 62, which as before indicate energy levels for both electrons and holes in layer 12, open downwards and, similarly, curved lines 64, which indicate energy levels for both electrons and holes in layer 14, open upwards. As before, lines 61 represent energy levels in layer 11 and line 63 represents the Fermi energy level in base 13. Since, the charge on the surface of layer 11 in this instance is positive, lines 61 are inclined downward to the left due to the particular potential gradient or electrical field set up in member 10 by the charge, as mentioned earlier when FIGS. 2, 3 and 4 were explained.

As is illustrated in the energy level diagram, Fermi level 63 of conductive backing member 13 is relatively high with respect to the energy levels of adjacent semiconductor layer 14 and only a very thin or sharp upward turn of the energy levels exists between layer 14 and member 13. Consequently, electrical charge can pass through the interface between layer 14 and base 13, whereby electrical charge from base 13 can effectively penetrate or tunnel through the interface and thus make the electrical effect of semiconductor layer 14 analogous to the electric effect of base 13 in FIG. 1. Thus, layer 14 becomes a supply source of electrons or negative carriers and the strongly p-type semiconductor layer 12 has substantially the same effect as the p-type layer 12 in FIG. 1, whereby the initiation of charge migration through photon activation causes a secondary conductivity between the elements of composite member 10 in the same manner as previously described in connection with the embodiment of FIG. 1.

When negative charge is distributed on the free surface of photoconductive layer 11, we obtain an energy level diagram as shown in FIG. 7. In this case, layer 12 is strongly n-type whereas layer 14 is strongly p-type with the result that the diagram of FIG. 7 is a mirror image (along the vertical axis) of the diagram of FIG. 6.

As illustrated in the diagram, charge can migrate through the sharp thin "tail" of the energy diagram existing at the interface between layer 14 and base 13 so that the initiation of photon-activated migration will cause a high degree of conductivity and secondary conduction through the successive layers of the photosensitive member. In the present situation, however, the secondary conduction will be made up of holes flowing from base 13 for the same reasons presented when the diagram of FIG. 4 was discussed.

The diagram of FIG. 8 is almost identical with that of FIG. 6, the only difference between the two being that in deriving the FIG. 6 energy level diagram, a high work function base 13 was utilized whereas in deriving the FIG. 8 diagram, a low work function base 13 was used. Thus, here again, layer 12 represented in the energy diagram as 82 is p-type and layer 14 represented 84 is n-type with the charge distributed on the free surface of layer 11 being positive. Accordingly, since there is very little difference between upper energy level 84 and Fermi level 83 and since there is almost no upward projection between energy levels 82 and 84, it is quite apparent that carriers can readily migrate between layers 12 and 14, thus affording to layer 14 a large supply of carriers having a polarity opposite to that of the charge on the free surface of photoconductive layer 11.

In all the cases illustrated herein, it is observed that the conductivity initiated by the combination of photon activation and structural relationship is conductivity from and to the surface of the insulating layer 11 directly to the backing member 13 and is not conductivity laterally along the surface of the insulating layer. Thus, a photosensitive member of the present invention is particularly useful in the art known as xerography or electrophotography wherein it is desired to form upon a minimum exposure to activating radiation an electrostatic image corresponding in both intensity and pattern to the image of radiation to which the member is exposed. The resulting electrostatic image can then be developed by suitable means such as, for example, dusting with finely divided charged electrostatic material or may be otherwise used according to conventional methods of the art.

To illustrate the use of the plate of FIG. 5 in the xerographic process, reference will now be had to FIGS. 9(*a*), (*b*) and (*c*). When an electrostatic charge is placed on the free surface of a xerographic plate charges of the opposite polarity are induced in layer 12. On exposure to activating radiation, assuming the surface charged to be positive, holes then migrate to layer 12 where they are held in the hook as shown. In the case of the embodiment of FIG. 1, these bound holes are close enough to base 13 that an intense electrostatic field exists between the bound holes and base 13 causing injection of electrons from base 13. However, in the embodiment of FIG. 5, layer 12 is separated from base 13 by layer 14. As a result the field between the bound negative charges in layer 12 created by induction from the surface charges on layer 11 effectively neutralize any field between the charges retained in the hook in layer 12 and base 13. Thus, the charges migrating to the hook in layer 12 serve mainly to neutralize the induced charges in layer 12 and are ineffective to produce photon multiplication as described hereinabove. Accordingly, the use of the member of FIG. 5 to obtain photon multiplication as described herein necessitates the use of an applied electrostatic field during exposure as shown in FIG. 9(*b*).

Thus, the process requires placing a uniform electrostatic potential on the surface of member 11 as shown for example in FIG. 9(*a*) wherein a corona charging unit 15 connected to a corona generating potential 16 passes over the free surface of layer 11 in the dark to deposit thereon a uniform layer of electrostatic potential. A transparent electrode 17 is then positioned closely adjacent to the free surface of layer 11 and a strong electrostatic potential (illustrated by potential source 18) applied between base member 13 and electrode 17. While this potential is applied, activating radiation is applied through suitable means 19. Due to the applied field from potential source 18 via electrode 17, the induced charges in layer 12 are effectively bound by the applied potential and, thus, do not interfere with the holes moving through layer 11 and retained at the hook formed in layer 12 represented by energy level 62. Accordingly, the charges retained in the hook are effective to cause injection of additional carriers from backing 13 as described above resulting in an electrostatic image on the free surface of layer 11 which may then be made visible by the deposition thereon of electroscopic marking material 20. If electroscopic material 20 has the same polarity of electrostatic charge as the electrostatic image, the resulting would be a reversal rather than the positive reproduction shown in FIG. 9(*c*). If desired, the use of an externally applied field during exposure may also be used with the embodiment of FIG. 1 although as seen above this is not necessary with that embodiment.

It is to be understood and realized that there is a certain amount of leeway and experimentation possible in the scope of the present invention. Thus, for example, the concentration of modifying impurities in the semiconductor layer or layers will be varied, depending upon the nature of the backing material and depending on the nature of the photoconductive insulator. Optimum results can be achieved by application of the considerations presented herein and by reference to the specific illustrations and selections of structures and ingredients. For this reason, the specific examples named herein are to be regarded as guides indicating the directions along which progress can be made, and one skilled in the art can realize the applications of these same principles to systems containing different materials or structures.

This application is a continuation-in-part of my copending application S.N. 437,460, filed June 17, 1954.

I claim:

1. A xerographic plate comprising in combination an insulating layer from about 20 to 200 microns thick having a resistivity of at least about $10^{13}$ ohms-cm. and a long range for charge carriers said insulating layer being adapted to receive electrical charges of a first polarity distributed upon the free surface of said insulating layer, a first layer of semiconductor material one of whose surfaces is in intimate surface contact with the other of the surfaces of said insulating layer, the majority charge carriers in said first semiconductor layer being of said first polarity, a second layer of semiconductor material one of whose surfaces is in intimate surface contact with the other of the surfaces of said first semiconductor layer, the majority charge carriers in said second layer being of the opposite polarity to said first polarity, said first and second semiconductor layers being each about 0.1 to 5 microns thick and said first semiconductor layer having a long range for the minority charge carriers, and a base member which is electrically conductive and in intimate contact with the other surface of said second semiconductor layer.

2. A xerographic plate according to claim 1 wherein said insulating layer has a long range for charge carriers of a polarity opposite to said first polarity and one of said insulating layer and said base member being transparent to activating radiation.

3. A xerographic plate according to claim 1 wherein said insulating alyer is a photoconductive insulating material having a long range for both polarities of charge carriers.

4. A xerographic plate according to claim 1 wherein said insulating layer consists essentially of vitreous selenium.

5. A xerographic plate according to claim 1 wherein said base member is transparent to activating radiation.

6. A xerographic plate according to claim 1 wherein said insulating layer consists of cadmium selenide, said first polarity is positive and said base member is transparent to activating radiation.

7. A method of xerography comprising placing sensitizing electrostatic charges of a first polarity on the free surface of a photoconductive insulating layer about 20 to 200 microns thick and having a long range for both polarities of charge carriers, said photoconductive insulating layer being supported on a conductive backing surface with an interlayer about 0.1 to 5 microns thick therebetween of a semiconductor material whose majority charge carriers are of said first polarity and which has a long range for the minority charge carriers so that said minority charge carriers can traverse said interlayer, the energy level of said semiconductor being such as to present a barrier to said backing surface of at least about 0.7 electron volt for said minority charge carriers between said photoconductive insulating layer and said backing surface, and exposing said photoconductive insulating layer to a pattern of activating radiation thereby creating hole electron pairs in said photoconductive insulating layer, the charges opposite to said first polarity moving through said photoconductive insulating layer to the free surface thereof to neutralize electrostatic charges thereon, the charges of said first polarity created by said activating radiation within said photoconductive insulating layer moving through said photoconductive insulating layer under the field created by said sensitizing charges and said conductive backing surface to said semiconductor interlayer, whereby said first polarity charges are retained at said interlayer closely adjacent to said conductive backing surface thereby creating a strong electrostatic field therebetween, which causes injection of electric charges opposite to said first polarity from said conductive backing surface into and through said interlayer into said photoconductive insulating layer whereby they move to the free surface of said photoconductive insulating layer to neutralize the electrostatic charges thereon, several charges opposite to said first polarity being injected for each first polarity charge retained at said barrier thus creating a developable electrostatic image on the free surface of said photoconductive insulating layer.

8. A xerographic method according to claim 7 wherein said photoconductive insulating layer is selected from the group consisting of vitreous selenium and photoconductive insulating alloys thereof.

9. A xerographic method according to claim 7 wherein said photoconductive insulating layer consists essentially of vitreous selenium, said semiconductor material is metallic selenium and said first polarity is positive.

10. A method of xerography according to claim 7 wherein said photoconductive insulating layer consists essentially of vitreous selenium, said semiconductor material consists essentially of vitreous selenium with small amounts of hole donor impurities therein and said first polarity is positive.

11. A method of xerography according to claim 7 wherein said photoconductive insulating layer consists essentially of vitreous selenium, said semiconductor material consists essentially of vitreous selenium with small amounts of halogen atoms therein and said first polarity is positive.

12. A method of xerography according to claim 7 wherein said photoconductive insulating layer consists essentially of vitreous selenium, said semiconductor material consists essentially of vitreous selenium with small amounts of an electron donor impurity therein and said first polarity is negative.

13. A xerographic method according to claim 7 wherein said photoconductive insulating layer consists essentially of vitreous selenium, said semiconductor material consists essentially of vitreous selenium with small amounts of an electron donor impurity selected from the group consisting of arsenic and tellurium therein and said first polarity is negative.

14. A method of xerography comprising placing sensitizing electrostatic charges of a first polarity on the free surface of an insulating layer about 20 to 200 microns thick and having a long range for both polarities of charge carriers, said insulating layer being supported on a conductive backing surface with an interlayer about 0.1 to 5 microns thick therebetween of a semiconductor material whose majority charge carriers are of said first polarity and which has a long range for the minority charge carriers so that said minority charge carriers can traverse said interlayer, the energy level of said semiconductor being such as to present a barrier to said backing surface of at least about 0.7 electron volt for said minority charge carriers between said insulating layer and said backing surface, and exposing said inter layer to a pattern of activating radiation thereby creating hole electron pairs in said interlayer, whereby charges of said first polarity generated by said activating radiation are retained at the barrier in said interlayer closely adjacent to said conductive backing surface thereby creating a strong electrostatic field therebetween which causes injection of electric charges opposite to said first polarity from said conductive backing surface into and through said interlayer into said insulating layer whereby they move to the free surface of said insulating layer to neutralize the electrostatic charges thereon, several charges opposite to said first polarity being injected for each first polarity charge retained at said barrier thus creating a developable electrostatic image on the free surface of said insulating layer.

15. A method of xerography according to claim 14 wherein said conductive backing is transparent to said activating radiation.

16. A method of xerography according to claim 14 wherein said insulating layer is transparent to said activating radiation.

17. A method of xerography according to claim 14 wherein said insulating layer consists essentially of vitreous selenium.

18. A method of xerography according to claim 14 wherein said insulating layer is cadmium selenide, said first polarity is positive and said conductive backing is transparent to said activating radiation.

19. A method of xerography comprising placing sensitizing electrostatic positive charges on the free surface of a photoconductive insulating material from about 20 to 200 microns thick and having a long range for both polarities of charge carriers on one surface of a p-type semiconductor layer about 0.1 to 5 microns thick having a long range for the minority charge carriers, the other surface of said p-type semiconductor being supported by one surface of an n-type semiconductor layer about 0.1 to 5 microns thick, the other surface of said n-type semiconductor resting on an electrically conductive support member, positioning a transparent conductive electrode adjacent to the free surface of said photoconductive insulating layer, applying a positive electrostatic potential between said electrode and said base member and while said field is applied exposing the free surface of said photoconductor to a pattern of activating radiation whereby there is formed a developable electrostatic image on the free surface of said photoconductive insulating layer.

20. A method of xerography according to claim 19 wherein said photoconductive insulating material consists essentially of vitreous selenium, said p-type semiconductor consists essentially of vitreous selenium having therein halogen atoms and said n-type semiconductor consists essentially of vitreous selenium containing an electron donor impurity selected from the group consisting of arsenic and tellurium.

21. A method of xerography according to claim 19 wherein said photoconductive insulating material consists essentially of vitreous selenium, said p-type semiconductor consists essentially of metallic selenium and said n-type semiconductor consists essentially of vitreous selenium containing therein an electron donor impurity selected from the group consisting of arsenic and tellurium.

22. A method of xerography comprising placing sensitizing electrostatic negative charges on the free surface of a photoconductive insulating material from about 20 to 200 microns thick and having a long range for both polarities of charge carriers on one surface of an n-type semiconductor layer about 0.1 to 5 microns thick having a long range for the minority charge carriers, the other surface of said n-type semiconductor being supported by one surface of a p-type semiconductor layer about 0.1 to 5 microns thick, the other surface of said p-type semiconductor resting on an electrically conductive support member, positioning a transparent conductive electrode adjacent to the free surface of said photoconductive insulating layer, applying a negative electrostatic potential between said electrode and said base member and while said field is applied exposing the free surface of said photoconductor to a pattern of activating radiation whereby there is formed a developable electrostatic image on the free surface of said photoconductive insulating layer.

23. A method of xerography according to claim 22 wherein said photoconductive insulating material consists essentially of vitreous selenium, said n-type semiconductor consists essentially of vitreous selenium containing therein an electron donor impurity selected from the group consisting of arsenic and tellurium and said p-type semiconductor consists essentially of metallic selenium.

24. A method of xerography according to claim 22 wherein said photoconductive insulating material consists essentially of vitreous selenium, said n-type semiconductor consists essentially of vitreous selenium containing therein an electron donor impurity selected from the group consisting of arsenic and tellurium and said p-type semiconductor consists essentially of vitreous selenium with small amounts of halogen atoms therein.

25. A method of xerography comprising placing sensitizing electrostatic positive charges on the free surface of an insulating material from about 20 to 200 microns thick and having a long range for negative charge carriers on one surface of a p-type semiconductor layer about 0.1 to 5 microns thick having a long range for the minority charge carriers, the other surface of said p-type semiconductor being supported by one surface of an n-type semiconductor layer about 0.1 to 5 microns thick, the other surface of said n-type semiconductor resting on an electrically conductive support member, positioning a transparent conductive electrode adjacent to the free surface of said insulating layer, applying a positive electrostatic potential between said electrode and said base member and while said field is applied exposing said p-type semiconductor layer to a pattern of activating radiation whereby there is formed a developable electrostatic image on the free surface of said insulating layer.

26. A method of xerography comprising placing sensitizing electrostatic negative charges on the free surface of an insulating material from about 20 to 200 microns thick and having a long range for positive charge carriers on one surface of an n-type semiconductor layer about 0.1 to 5 microns thick having a long range for the minority charge carriers, the other surface of said n-type semiconductor being supported by one surface of a p-type semiconductor layer about 0.1 to 5 microns thick, the other surface of said p-type semiconductor resting on an electrically conductive support member, positioning a transparent conductive electrode adjacent to the free surface of said insulating layer, applying negative electrostatic potential between said electrode and said base member and while said field is applied exposing said n-type semiconductor layer to a pattern of activating radiation whereby there is formed a developable electrostatic image on the free surface of said insulating layer.

27. A method of xerography comprising placing sensitizing electrostatic positive charges on the free surface of an insulating material from about 20 to 200 microns thick and having a long range for negative charge carriers on one surface of a p-type semiconductor layer about 0.1 to 5 microns thick having a long range for the minority charge carriers, the other surface of said p-type semiconductor being supported by one surface of an n-type semiconductor layer about 0.1 to 5 microns thick, the other surface of said n-type semiconductor resting on an electrically conductive transparent support member, positioning an electrically conductive electrode adjacent to the free surface of said insulating layer, applying a positive electrostatic potential between said electrode and said base member and while said field is applied exposing the n-type semiconductor layer to a pattern of activating radiation whereby there is formed a developable electrostatic image on the free surface of said insulating layer.

28. A method of xerography according to claim 27 wherein said insulating material consists essentially of cadmium selenide, said p-type semiconductor is selected from the group consisting of metallic selenium and vitreous selenium containing therein halogen atoms and said n-type semiconductor consists essentially of vitreous selenium containing therein an electron donor impurity selected from the group consisting of arsenic and tellurium.

29. A method of xerography comprising placing sensitizing electrostatic negative charges on the free surface of an insulating material from about 20 to 200 microns thick and having a long range of positive charge carriers on one surface of an n-type semiconductor layer about 0.1 to 5 microns thick having a long range for the minority charge carriers, the other surface of said n-type semiconductor being supported by one surface of a p-type semiconductor layer about 0.1 to 5 microns thick, the other surface of said p-type semiconductor resting on an electrically conductive transparent support member, positioning an electrically conductive electrode adjacent to the free surface of said insulating layer, applying a negative electrostatic potential between said electrode and said base member and while said field is applied exposing the p-type semiconductor layer to a pattern of activating radiation whereby there is formed a developable electrostatic image on the free surface of said insulating layer.

30. A xerographic plate comprising in combination an insulating layer from about 20 to 200 microns thick having a resistivity of at least about $10^{13}$ ohms-cm. and a long range for both polarities of charge carriers, said insulating layer being adapted to receive electrical charges of a first polarity distributed upon the free surface of said insulating layer, an interlayer of semiconductor material between said insulating layer and an electrically conductive base member, said semiconductor layer being from about 0.1 to 5 microns thick and having a long range for the minority charge carriers, the majority charge carriers of said semiconductor layer being of said first polarity, said base member having a supply of charge carriers of a polarity opposite to said first polarity and a work function sufficient to form a barrier with said semiconductor layer of at least about 0.7 electron volt, said plate being characterized by high sensitivity to activating radiation.

31. A method of xerography comprising positioning an electrically conductive electrode adjacent to the free surface of a photoconductive insulating layer about 20–200 microns thick and having a long range of both polarities of charge carriers, said photoconductive insulating layer being supported on a conductive backing surface with a layer about 0.1–5 microns thick therebetween of a semiconductor material whose majority charge carriers are of a first polarity and which has a long range for the minority charge carriers so that said minority charge carriers can traverse said interlayer, the energy level of said semiconductor being such as to present a barrier to said backing surface of at least about 0.7 electron volt for said minority charge carriers between said photoconductive insulating layer and said backing surface, applying an electrostatic potential between said electrode and said backing surface, said electrode being connected to an electrostatic potential of said first polarity, and while said field is applied exposing said photoconductive insulating layer to a pattern of activating radiation thereby creating hole electron pairs in said photoconductive insulating layer, the charges opposite to said first polarity moving through said photoconductive insulating layer to the free surface thereof, the charges of said first polarity created by said activating radiation within said photoconductive insulating layer moving through said photoconductive insulating layer under the field maintained between said electrode and said backing surface to said semiconductor interlayer whereby said first polarity charges are retained at said interlayer closely adjacent to said backing surface thereby creating a strong electrostatic field therebetween which causes injection of electric charges opposite to said first polarity from said backing surface into and through said interlayer into said photoconductive insulating layer whereby they move to the surface of said photoconductive insulating layer thus creating a developable electrostatic image on the free surface of said photoconductive insulating layer.

32. A xerographic method according to claim 31 wherein said photoconductive insulating layer is selected from the group consisting of vitreous selenium and photoconductive insulating alloys thereof.

33. A xerographic method according to claim 31 wherein said conductive backing is transparent to said activating radiation.

34. A method of xerography comprising positioning an electrically conductive electrode adjacent to the free surface of an insulating layer about 20–200 microns thick and having a long range for both polarities of charge carriers, said insulating layer being supported on a conductive backing surface with a layer about 0.1–5 microns thick therebetween of a semi-conductor material whose majority charge carriers are of a first polarity and which has a long range for the minority charge carriers so that said minority charge carriers can traverse said interlayer, the energy level of said semi-conductor being such as to present a barrier to said backing surface of at least about 0.7 electron volt for said minority charge carriers between said photoconductive insulating layer and said backing surface, applying an electrostatic potential between said electrode and said backing surface, said electrode being connected to an electrostatic potential of said first polarity, and while said field is applied exposing said interlayer to a pattern of activating radiation thereby creating whole electron pairs in said interlayer, whereby the charges of said first polarity generated by said activating radiation are retained at said interlayer closely adjacent to said backing surface thereby creating a strong electrostatic field therebetween which causes injection of electric charges opposite to said first polarity from said backing surface into and through said interlayer into said photoconductive insulating layer whereby they move to the surface of said photoconductive insulating layer thus creating a developable electrostatic image on the free surface of said photoconductive insulating layer.

35. A xerographic method according to claim 34 wherein said conductive backing is transparent to said activating radiation.

36. A xerographic method according to claim 35 wherein said insulating layer consists essentially of vitreous selenium.

37. A xerographic method according to claim 35 wherein said insulating layer consists essentially of vitreous selenium and said interlayer is selected from the group consisting of cadmium sulfide and cadmium selenide.

38. A xerographic method according to claim 35 wherein said insulating layer consists essentially of vitreous selenium and said interlayer is a photoconductive selenium-tellurium alloy.

References Cited in the file of this patent

UNITED STATES PATENTS

| | | |
|---|---|---|
| 2,582,850 | Rose | Jan. 15, 1952 |
| 2,663,636 | Middleton | Dec. 22, 1953 |
| 2,687,484 | Weimer | Aug. 24, 1954 |
| 2,693,416 | Butterfield | Nov. 2, 1954 |
| 2,739,079 | Keck | Mar. 20, 1956 |
| 2,776,367 | Lehovec | Jan. 1, 1957 |
| 2,808,328 | Jacob | Oct. 1, 1957 |
| 2,853,383 | Keck | Sept. 23, 1958 |
| 2,901,348 | Dessauer et al. | Aug. 25, 1959 |

OTHER REFERENCES

Rose: R.C.A. Review, vol. XII, No. 3, pages 408–411 (September 1951).

McKay: Physical Review, vol. 84, pages 833–835 (1951).

Shockley et al.: Ibid., vol. 83, pages 156–161 (1951).

UNITED STATES PATENT OFFICE
CERTIFICATE OF CORRECTION

Patent No. 3,041,166 June 26, 1962

John Bardeen

It is hereby certified that error appears in the above numbered patent requiring correction and that the said Letters Patent should read as corrected below.

Column 10, line 8, for "srtiking" read -- striking --; column 13, line 63, for "alyer" read -- layer --; column 15, line 12, for "inter layer" read -- interlayer --; column 17, line 29, for "of" read -- for --.

Signed and sealed this 23rd day of April 1963.

(SEAL)
Attest:

ERNEST W. SWIDER
Attesting Officer

DAVID L. LADD
Commissioner of Patents